(12) United States Patent
Lee et al.

(10) Patent No.: US 6,649,488 B2
(45) Date of Patent: Nov. 18, 2003

(54) METHOD OF SHALLOW TRENCH ISOLATION

(75) Inventors: Jae Suk Lee, Icheon-si (KR); Dae Heok Kwon, Daejeon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/304,696

(22) Filed: Nov. 27, 2002

(65) Prior Publication Data

US 2003/0100168 A1 May 29, 2003

(30) Foreign Application Priority Data

Nov. 28, 2001 (KR) ......................................... 2001-74624

(51) Int. Cl.$^7$ ............................................... H01L 21/76
(52) U.S. Cl. ........................ 438/424; 438/431; 438/446
(58) Field of Search .................. 438/424, 430, 438/431, 432, 425, 426, 428, 445, 446, 448; 287/506, 508, 510, 513, 514, 515, 518, 520

(56) References Cited

U.S. PATENT DOCUMENTS 6,074,927 A * 6/2000 Kepler et al. ............... 438/400
6,339,004 B1 * 1/2002 Kim ............................ 438/296

* cited by examiner

*Primary Examiner*—Jack Chen
(74) *Attorney, Agent, or Firm*—Jacobson Holman PLLC

(57) ABSTRACT

After a trench is formed into a substrate, a polysilicon layer is formed on sidewalls and a bottom of the trench. A thermal oxidation is performed on the polysilicon layer such that a polysilicon oxide layer is formed thereon. Then, a portion of the polysilicon oxide layer is removed such that the polysilicon layer is exposed on the bottom of the trench while the sidewalls of the trench are still covered by the polysilicon oxide layer. A TEOS-ozone oxide layer is deposited on the substrate to fill the trench. Since the bottom of the trench has a better condition for the deposition of TEOS-ozone oxide layer than that of the sidewalls, a gap fill quality can be enhanced.

6 Claims, 5 Drawing Sheets

US 6,649,488 B2

METHOD OF SHALLOW TRENCH ISOLATION

FIELD OF THE INVENTION

The present invention relates to a method of shallow trench isolation for a semiconductor device; and, more particularly, to a method of filling a trench for isolation in a semiconductor device.

BACKGROUND OF THE INVENTION

An integrated circuit is formed from a silicon substrate within and upon whose surfaces are formed resistors, transistors, diodes and other electrical circuit elements. The electrical circuit elements are connected internally and externally to the silicon substrate upon which they are formed through patterned conductor layers that are separated by dielectric layers.

As integrated circuit device technology has advanced and integrated circuit device dimensions have decreased, it has become increasingly common within advanced integrated circuits to employ a trench isolation method such as a shallow trench isolation (STI) method and a recessed silicon dioxide isolation (ROI) method to form trench isolation regions nominally coplanar with adjoining active semiconductor regions of a silicon substrate. Such a trench isolation method typically employs a chemical mechanical polish (CMP) planarizing method to provide a nominally planarized surface to a trench isolation region formed from a trench fill dielectric layer formed within the trench.

To fill a STI trench, an isolation dielectric such as silicon dioxide is deposited over a silicon substrate by using chemical vapor deposition (CVD) technique, such as low pressure TEOS (tetraethylorthosilicate) (LPCVD), TEOS-ozone atmospheric pressure (APCVD), sub-atmospheric pressure (SACVD), or high density plasma CVD (HDP-CVD). In particular, a TEOS-ozone ($O_3$-TEOS) oxide film is widely used as the isolation dielectric for filling the STI trench because of a superior surface mobility thereof.

A prior art associated with the shallow trench isolation (STI) and the integration of trench filling by TEOS-ozone will be explained with reference to FIGS. 1 and 2.

A silicon substrate 10 is shown in FIG. 1; formed on the silicon substrate 10 is a sacrificial layer 12, which includes a layer of pad thermal silicon dioxide (not shown) grown on a surface of the silicon substrate 10 and a layer of pad silicon nitride (not shown) deposited on the layer of pad thermal silicon dioxide. A trench 14 is etched through the sacrificial layer 12 and partially into the substrate 10, followed by thermal silicon dioxide 16 growth inside the trench 14, i.e., sidewalls and a bottom thereof. A reactive ion etch (RIE) process and a LPCVD process are usually used for forming the trench 14 and the silicon dioxide 16, respectively.

Then, in FIG. 2, a TEOS-ozone oxide film 18 is deposited over the silicon substrate 10 to fill the trench 14 by using APCVD, followed by annealing. Finally, the TEOS-oxide film 18 is planarized by using CMP.

There are some process problems in the prior art associated with shallow trench isolation (STI) and the integration of trench filling by TEOS-ozone. Process problems that arise under certain conditions are the formation of voids and seams in the isolating dielectric, i.e., the TEOS-ozone oxide, which fills the trench. Since the formation of voids or seams more frequently occurs at a higher aspect ratio of the trench, the prior art STI cannot be employed for a highly integrated semiconductor device that may require a high aspect ratio trench for a decreased device dimension. Accordingly, a more improved gap fill method has been developed to avoid the occurrence of the voids or seams in the TEOS-ozone oxide.

SUMMARY OF THE INVENTION

It is, therefore, an object of the present invention to provide an improved method of filling a high aspect ratio trench for shallow trench isolation.

In accordance with a preferred embodiment of the invention, there is provided a method of shallow trench isolation, including the steps of: forming a trench into a substrate; forming a polysilicon layer on sidewalls and a bottom of the trench; thermally oxidizing the polysilicon layer so as to form a thermal oxide layer on the polysilicon layer; removing a portion of the thermal oxide layer such that the polysilicon layer is exposed on the bottom of the trench, while leaving the thermal oxide layer on the sidewalls of the trench; and depositing a TEOS-ozone oxide layer on the substrate to fill the trench.

In accordance with another preferred embodiment of the present invention, there is provided a shallow trench isolation method, including the steps of: forming a sacrificial layer on a silicon substrate; forming a trench through the sacrificial layer and partially into the silicon substrate; thermally oxidizing exposed portions of the silicon substrate in the trench such that a thermal oxide layer is formed on sidewalls and a bottom of the trench; removing a portion of the thermal oxide layer on the bottom of the trench, while leaving the thermal oxide layer on the sidewalls of the trench; and depositing a TEOS-ozone oxide layer on the silicon substrate to fill the trench.

BRIEF DESCRIPTION OF THE DRAWINGS

The above and other objects and features of the present invention will become apparent from the following description of a preferred embodiment given in conjunction with the accompanying drawings, in which.

DETAILED DESCRIPTION OF THE PREFERRED EMBODIMENT

Figure 1:
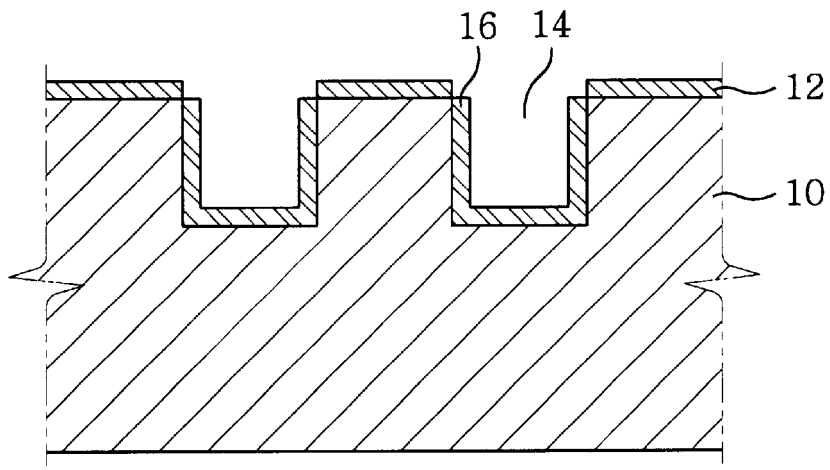
FIGS. 1 and 2 are cross-sectional views illustrating a sequence of a conventional process for fabricating shallow trench isolation in a semiconductor device.
Figure 2:
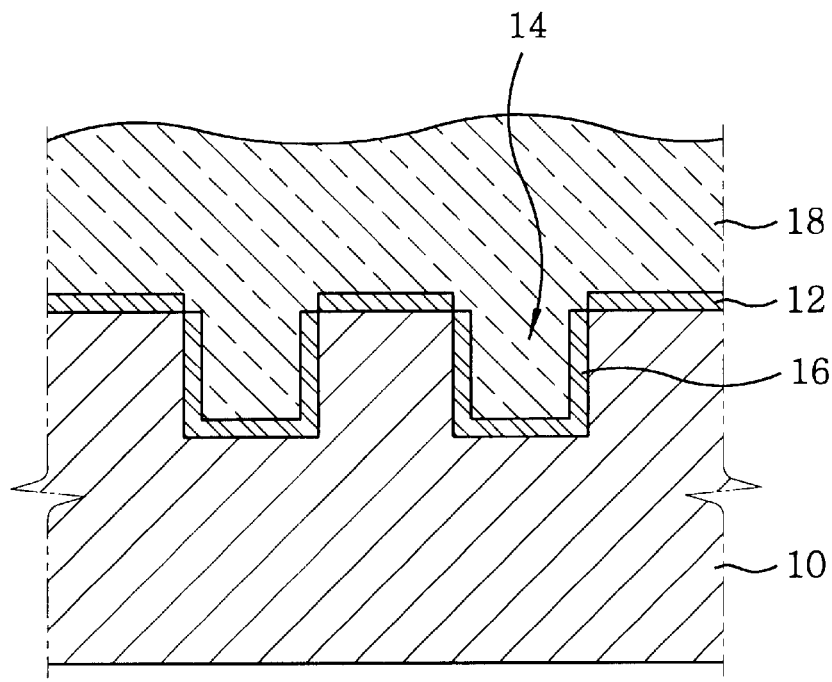

Referring now to FIGS. 3 to 9, methods of shallow trench isolation including a gap fill process in accordance with the preferred embodiments of the present invention will be described in detail. Like numerals represent like parts in the drawings.

Figure 3:
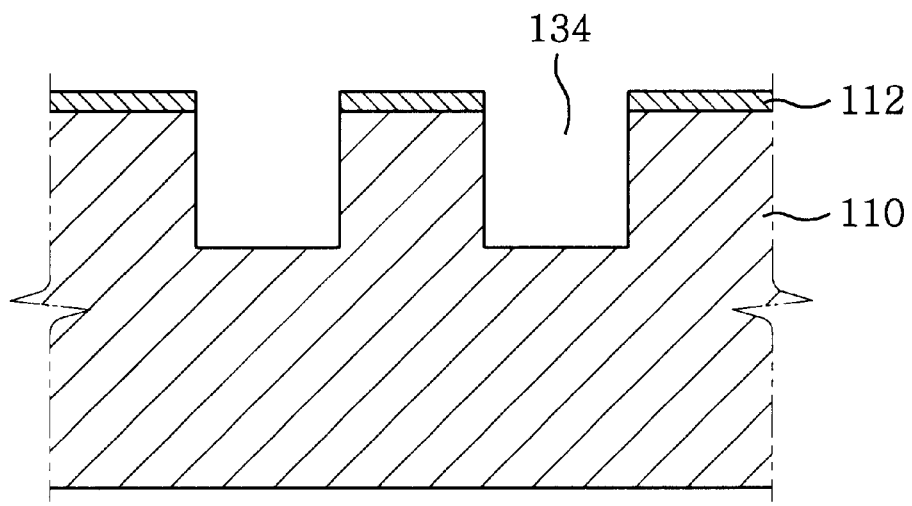
FIGS. 3 to 7 provide cross-sectional views illustrating a sequence of inventive processes for forming shallow trench isolation in accordance with a first preferred embodiment of the present invention.

FIGS. 3 to 7 provide cross-sectional views illustrating a sequence of the shallow trench isolation method in accordance with a first preferred embodiment of the present invention. In FIG. 3, after a sacrificial layer 112 is formed on a silicon substrate 110, trenches 134 are formed through the sacrificial layer 112 and partially into the silicon substrate 110.

Specifically, the sacrificial layer 112 includes a lower oxide (not shown) and an upper nitride (not shown), wherein the lower oxide serves to alleviate residual stress between the silicon substrate 110 and the upper nitride, which serves as a stopper during later CMP. The lower oxide is grown to a thickness of about 300 Å on the silicon substrate 110 by using a thermal oxidation process; the upper nitride is deposited to a thickness of about 1000 Å on the lower oxide by using CVD. After the sacrificial layer 112 is formed, a photoresist pattern (not shown) is formed by using photolithography to define trench regions thereon. Then, RIE is performed such that portions of the sacrificial layer 112 are removed and the trenches 134 are formed into the silicon substrate 110 at a depth of about 3000 Å.

Figure 4:
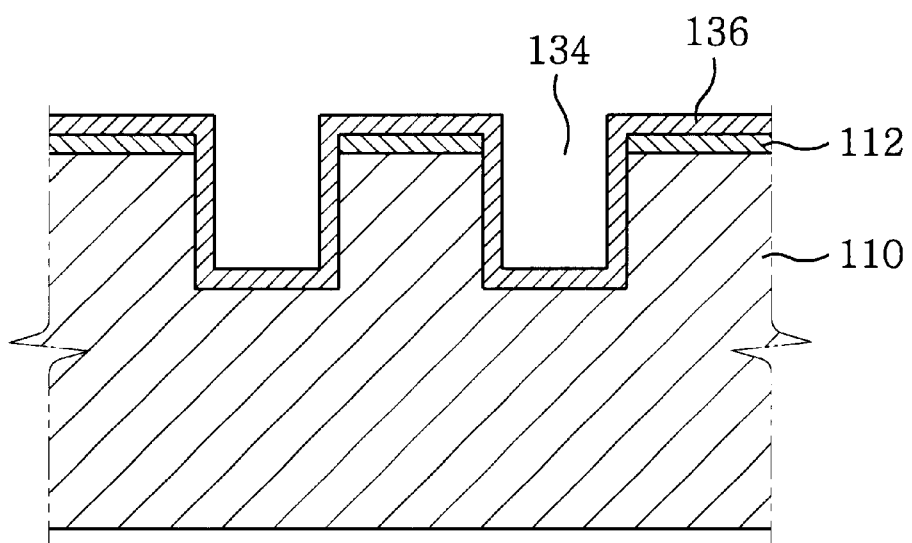
Figure 5:
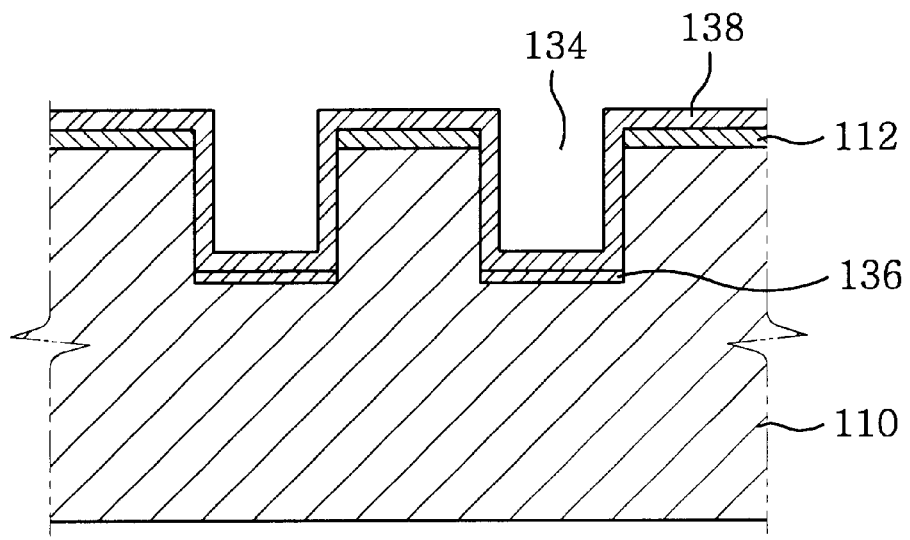

In FIG. 4, a polysilicon layer 136 having a thickness of about 2000 Å or less is formed on the sacrificial layer 112 and sidewalls and a bottom of the trench 134 by applying LPCVD. Then, the polysilicon layer 136 is thermally oxidized until a polysilicon oxide layer 138 that is a thermal oxide layer is formed to a predetermined thickness, as shown in FIG. 5, wherein a lower portion of the polysilicon layer 136 still remains in particular on the bottom of the trench 134 even after the thermal oxidation is completed. That is to say, after this step, the polysilicon layer 136 and the polysilicon oxide layer 138 coexist on the sacrificial layer 112 and the sidewalls and the bottom of the trench 134, wherein the polysilicon layer 136 is shown only on the bottom of the trench 134 in FIG. 5 for the purpose of convenience in later explanation.

Figure 6:
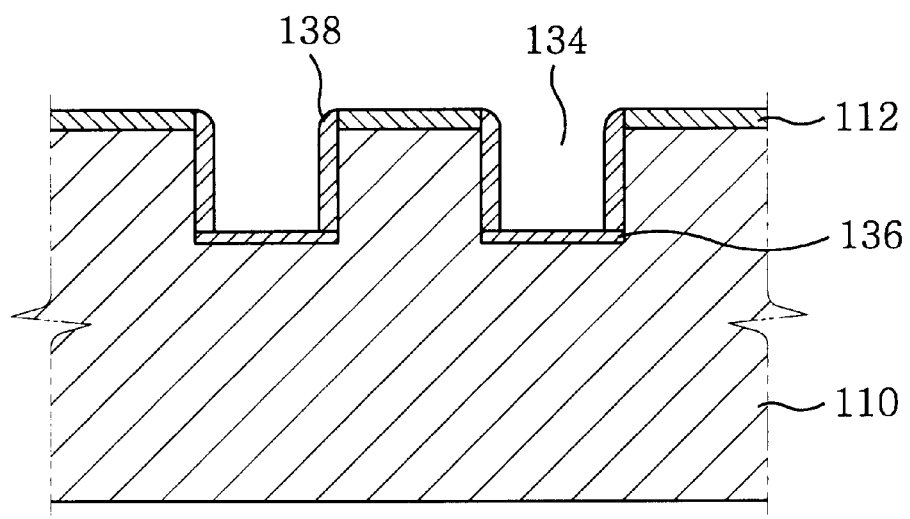

In FIG. 6, the polysilicon oxide layer 138 is partially removed by applying an anisotropic spacer etch such that the polysilicon layer 136 disposed on the bottom of the trench 134 is exposed while the sidewalls thereof are still covered by the polysilicon oxide layer 138 of a spacer shape.

Then, a plasma treatment is applied to the exposed polysilicon layer 136 on the bottom of the trench 134 to make a surface of the polysilicon layer 136 active. Inert gases such as Helium (He) and Argon (Ar) and/or reduction gases such as Hydrogen ($H_2$) are used for the plasma treatment. The polysilicon oxide layer 138 may be simultaneously exposed to the aforementioned plasma treatment, which is however less effective in making polysilicon oxide active. Accordingly, after the plasma treatment, the polysilicon layer 136 is made more active than the polysilicon oxide layer 138.

Figure 7:
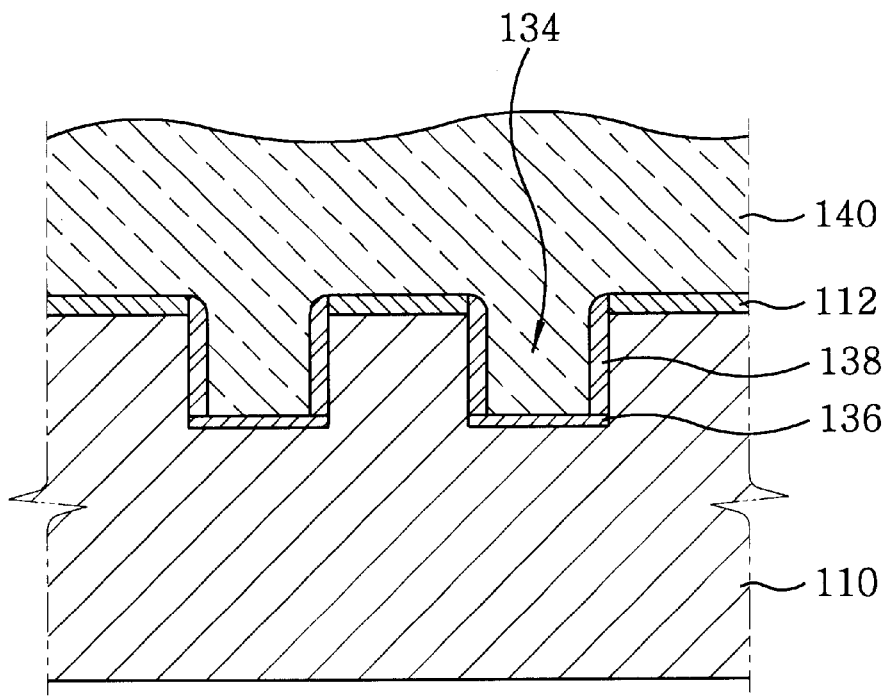

In FIG. 7, TEOS-ozone LPCVD or APCVD is performed on the sacrificial layer 112 and the sidewalls and the bottom of the trench 134 until a TEOS-ozone oxide film 140 is grown to an enough thickness, e.g., about 4500 Å, and fills the trench 134. Then, a thermal anneal to densify the TEOS-ozone oxide layer 140 and CMP to make the surface thereof planar are performed.

In the aforementioned gap fill process, a deposition rate of TEOS-ozone is higher at the bottom of the trench 134 than at the sidewalls thereof because the polysilicon layer 136 disposed on the bottom provides a better condition for the TEOS-ozone LPCVD than the polysilicon oxide layer 138 disposed on the sidewalls does. The difference in the deposition rates between at the bottom and at the sidewalls of the trench 134 is more increased because of the previous plasma treatment after which the polysilicon layer 136 is made more active than the polysilicon oxide layer 138.

Differentiating the deposition rates between at the bottom and at the sidewalls of the trench, i.e., enhancing the deposition rate at the bottom of the trench prevents occurrence of voids in the TEOS-ozone oxide that fills the trench, so that a superior gap fill quality can be obtained. Accordingly, the method in accordance with the first preferred embodiment of the present invention provides improved shallow trench isolation, i.e., an enhanced gap fill quality.

Figure 8:
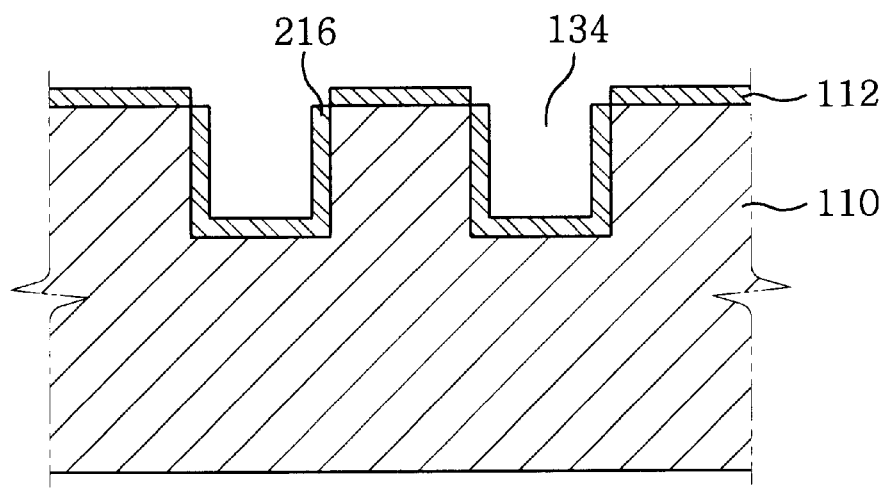
FIGS. 8 and 9 give cross-sectional views illustrating a sequence of inventive processes for forming shallow trench isolation in accordance with a second preferred embodiment of the present invention.
Figure 9:
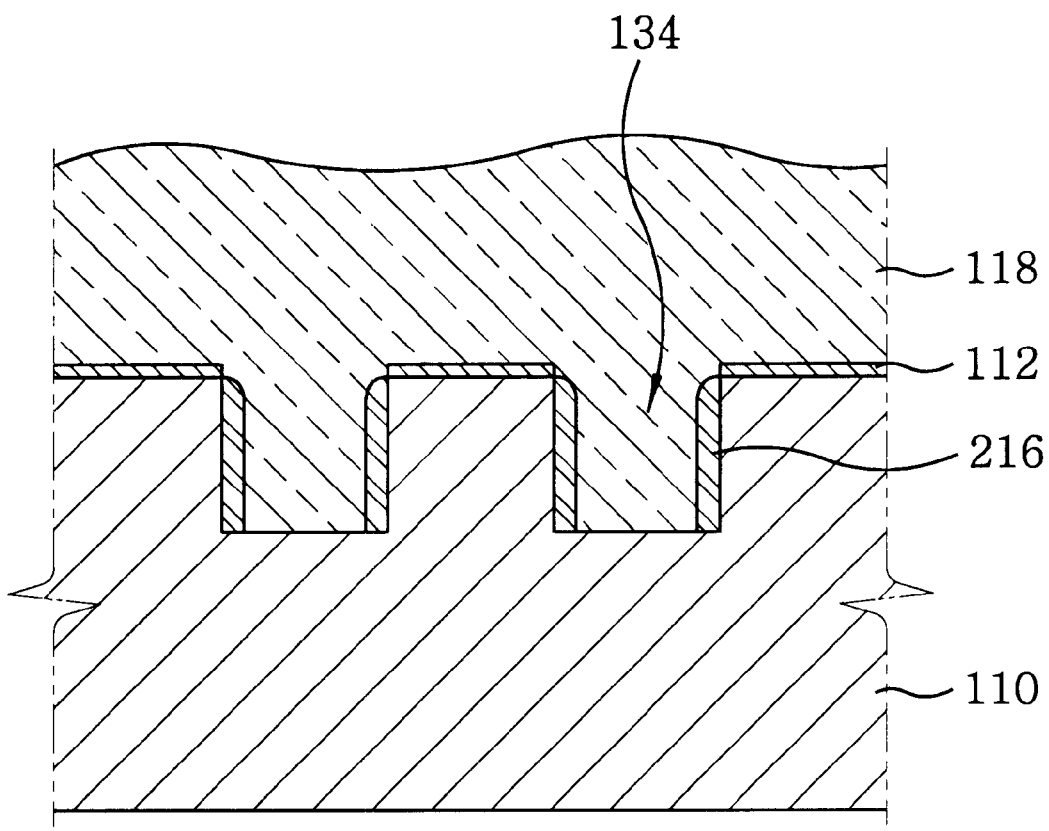

Hereinafter, a shallow trench isolation method in accordance with a second preferred embodiment of the present invention will be explained with reference to FIGS. 8 and 9, wherein the same steps or elements of the second preferred embodiment as those of the first preferred embodiment are omitted or simplified.

The second preferred embodiment is also associated with the enhancement of deposition rate at the bottom of the trench. However, instead of employing the polysilicon layer as a liner of the trench, the sidewalls and the bottom of the trench 134 are thermally oxidized such that a silicon oxide layer 216 that is a thermal oxide layer is formed thereon, as shown in FIG. 8. Then, a portion of the silicon oxide layer 216 is removed on the bottom of the trench 134 by using anisotropic spacer etch such that the silicon substrate 110 is exposed thereat while the sidewalls thereof are still covered by the silicon oxide layer 216 of a spacer shape, as shown in FIG. 9. A plasma treatment may be applied to the exposed portion of the silicon substrate 110 at the bottom of the trench 134.

Since the exposed portion of the silicon substrate 110 at the bottom of the trench 134 provides a better condition for the deposition of TEOS-ozone than the silicon oxide layer 216 on the sidewalls of the trench 134 does, the method in accordance with the second preferred embodiment of the present invention also provides an enhanced gap fill quality.

While the invention has been shown and described with respect to the preferred embodiments, it will be understood by those skilled in the art that various changes and modifications may be made without departing from the spirit and scope of the invention as defined in the following claims.

What is claimed is:

1. A method of forming shallow trench isolation, comprising the steps of:
   forming a trench into a substrate;
   forming a polysilicon layer on sidewalls and a bottom of the trench;
   thermally oxidizing the polysilicon layer so as to form a thermal oxide layer on the polysilicon layer;
   removing a portion of the thermal oxide layer such that the polysilicon layer is exposed on the bottom of the trench, while leaving the thermal oxide layer on the sidewalls of the trench; and
   depositing a TEOS-ozone oxide layer on the substrate to fill the trench.

2. The method of claim 1, wherein the step of removing the portion of the thermal oxide layer is performed by anisotropic etch.

3. The method of claim 1, wherein the step of depositing the TEOS-ozone oxide layer is performed by using low pressure chemical vapor deposition (LPCVD).

4. The method of claim 1, further comprising the step of plasma-treating the exposed portion of the polysilicon layer on the bottom of the trench before the step of depositing the TEOS-ozone oxide layer.

5. The method of claim 4, wherein the plasma-treating step is performed by using an inert gas.

6. The method of claim 4, wherein the plasma-treating step is performed by using a reduction gas.

* * * * *